(12) United States Patent
Bieling et al.

(10) Patent No.: US 10,324,380 B2
(45) Date of Patent: Jun. 18, 2019

(54) PROJECTION EXPOSURE APPARATUS AND METHOD FOR MEASURING AN IMAGING ABERRATION

(71) Applicant: Carl Zeiss SMT GmbH, Oberkochen (DE)

(72) Inventors: Stig Bieling, Aalen (DE); Helmut Haidner, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/869,606

(22) Filed: Jan. 12, 2018

(65) Prior Publication Data

US 2018/0196350 A1    Jul. 12, 2018

(30) Foreign Application Priority Data

Jan. 12, 2017 (DE) .................. 10 2017 200 428

(51) Int. Cl.
*G03F 7/20* (2006.01)

(52) U.S. Cl.
CPC .............. *G03F 7/706* (2013.01); *G03F 7/702* (2013.01); *G03F 7/7085* (2013.01); *G03F 7/70133* (2013.01); *G03F 7/70158* (2013.01); *G03F 7/70208* (2013.01)

(58) Field of Classification Search
CPC .. G03F 7/706; G03F 7/70158; G03F 7/70208; G03F 7/70133
USPC ........................................ 355/52, 53, 55, 67
See application file for complete search history.

(56) References Cited

U.S. PATENT DOCUMENTS

| | | |
|---|---|---|
| 6,650,399 B2 | 11/2003 | Baselmans et al. |
| 6,940,587 B2 | 9/2005 | Van Der Laan et al. |
| 7,187,431 B2 | 3/2007 | Kok et al. |
| 7,282,710 B1 | 10/2007 | Black et al. |
| 7,368,891 B2 | 5/2008 | Takahashi et al. |
| 7,388,652 B2 | 6/2008 | Van Der Sijs |
| 7,768,653 B2 | 8/2010 | Latypov et al. |
| 8,559,109 B2 | 10/2013 | Suenaga et al. |

(Continued)

FOREIGN PATENT DOCUMENTS

| | | |
|---|---|---|
| DE | 102005041373 A1 | 6/2006 |
| DE | 102008004762 A1 | 7/2009 |

(Continued)

*Primary Examiner* — Hung Nguyen
(74) *Attorney, Agent, or Firm* — Edell, Shapiro & Finnan, LLC (57) ABSTRACT

A microlithographic projection exposure apparatus (10) includes a projection lens (26) that images an object field (22) arranged in a mask plane (24) onto a substrate (28) during exposure operation of the projection exposure apparatus, and an illumination system (16) that has: an exposure illumination beam path (44) for radiating illumination radiation (14) onto the object field on the illumination side with respect to the mask plane, a measurement illumination beam path (48) for irradiating a measurement structure (54) arranged in the mask plane with the illumination radiation, and a scattering structure (50) arranged on the illumination side with respect to the mask plane and outside the exposure illumination beam path. The measurement illumination beam path extends via the scattering structure and runs rectilinearly between the scattering structure and the mask plane.

22 Claims, 3 Drawing Sheets

(56) References Cited

U.S. PATENT DOCUMENTS

| | | |
|---|---|---|
| 2004/0136070 A1 | 7/2004 | Gontin et al. |
| 2004/0169866 A1 | 9/2004 | Poultney |
| 2005/0259269 A1 | 11/2005 | Latypov et al. |
| 2006/0001890 A1 | 1/2006 | Poultney |
| 2006/0103826 A1 | 5/2006 | Kok et al. |
| 2006/0109533 A1 | 5/2006 | Schriever et al. |
| 2007/0153295 A1 | 7/2007 | Poultney |
| 2009/0021548 A1 | 1/2009 | Suzuki et al. |
| 2010/0284064 A1 | 11/2010 | Kruizinga et al. |
| 2011/0001947 A1 | 1/2011 | Dinger et al. |
| 2011/0013171 A1 | 1/2011 | Mueller et al. |
| 2013/0070221 A1* | 3/2013 | Bittner ............... G03F 7/7005 355/30 |
| 2013/0176547 A1 | 7/2013 | Van De Kerkhof et al. |
| 2015/0077728 A1 | 3/2015 | Laurent et al. |
| 2015/0286153 A1 | 10/2015 | Kok et al. |
| 2015/0355552 A1* | 12/2015 | Saenger ............ G03F 7/70075 250/504 R |

FOREIGN PATENT DOCUMENTS

| | | |
|---|---|---|
| DE | 102008000990 B3 | 11/2009 |
| DE | 102012207865 B3 | 7/2013 |
| EP | 1868034 A1 | 12/2007 |
| JP | 2004219423 A | 8/2004 |
| JP | 2005333141 A | 12/2005 |
| WO | 2004066366 A2 | 8/2004 |
| WO | 2004090490 A1 | 10/2004 |

\* cited by examiner

PROJECTION EXPOSURE APPARATUS AND METHOD FOR MEASURING AN IMAGING ABERRATION

CROSS REFERENCE TO RELATED APPLICATIONS

This application claims the benefit of and priority to German Patent Application No. 10 2017 200 428.2, filed on Jan. 12, 2017. The entire content and disclosure of this German patent application is incorporated into the present application by reference.

FIELD OF THE INVENTION

The invention relates to a microlithographic projection exposure apparatus and to a method for measuring an imaging aberration at a microlithographic projection exposure apparatus.

Various methods for the wavefront measurement of the projection lens of a microlithographic projection exposure apparatus are known in the prior art. They include e.g. a technique based on lateral shearing interferometry and also other interferometric techniques, such as point diffraction interferometry (PDI—"Point Diffraction Interferometer") and line diffraction interferometry (LDI—"Line Diffraction Interferometer"). Also possible is the use of a Shack-Hartmann sensor or a sensor based on moiré techniques.

BACKGROUND

In one embodiment of shearing interferometry, a measurement mask is positioned in the object plane of the optical system to be tested, a measurement structure in the form of a coherence mask being arranged on the measurement mask. The coherence mask can be embodied e.g. as a diffraction grating and serves to split illumination radiation incident on the coherence mask into various individual rays that pass through the projection lens on different paths. An analysis grating is situated in the image plane of the imaging system. The superimposition of the waves generated by diffraction at the analysis grating gives rise to a superimposition pattern in the form of an interferogram, which is detected with the aid of a suitable detector. Possible embodiments of a coherence mask and of a diffraction grating of a shearing interferometer are specified, for example, in DE 10 2005 041 373 A1.

An optimum measurement result is not always achieved since often it is not ensured that the individual rays generated by the coherence mask have an angular distribution that optimally fills the pupil of the projection lens. In other words, it is not always ensured that the intersection points of the paths of the individual rays with the pupil plane extend as closely meshed as possible over as far as possible the entire area of the pupil.

SUMMARY

It is an object of the invention to provide a projection exposure apparatus and a method for measuring an imaging aberration at a projection exposure apparatus which address the problems mentioned above. Further, related objects include improving the accuracy of a measurement of an imaging aberration at the projection exposure apparatus and, improving the pupil filling of the projection lens during the measurement of the imaging aberration, whilst keeping the complexity of the measurement low.

The above and other objects are achieved in accordance with a first aspect according to the invention, for example, by a microlithographic projection exposure apparatus comprising a projection lens for imaging an object field arranged in a mask plane onto a substrate during exposure operation of the projection exposure apparatus, and an illumination system. The illumination system comprises an exposure illumination beam path for radiating illumination radiation onto the object field on the illumination side with respect to the mask plane, a measurement illumination beam path for irradiating a measurement structure arranged in the mask plane with the illumination radiation, and a scattering structure arranged on the illumination side with respect to the mask plane and outside the exposure illumination beam path. In this case, the measurement illumination beam path extends via the scattering structure and runs rectilinearly between the scattering structure and the mask plane.

A scattering structure should be understood to mean a structure which has a scattering effect on incident radiation. That is to say that individual rays of the incident radiation, upon interaction with the scattering structure, i.e. upon reflection at the scattering structure or upon passage through the scattering structure, are deflected differently from their rectilinear path, or path predefined by the angle of reflection, as a result of interaction with small particles of the scattering structure. The incident radiation thus becomes more diffuse as a result of interaction with the scattering structure. To put it another way, the scattering structure brings about a conversion of radiation which is incident on the scattering structure in a manner free of divergence under an idealized assumption into radiation emanating from the scattering structure at a scattering or divergence angle of less than 15°, in particular of less than 10° or less than 8°. In this context, the scattering or divergence angle is understood to mean a deflection angle from the direction of propagation of the incident ray in the case of a scattering structure operated in transmission, or a deflection angle from the direction of propagation of the specularly reflected ray in the case of a reflective scattering structure. Preferably, the scattering function of the scattering structure proceeds continuously and is adapted to the numerical aperture of the projection lens. In this context, the scattering function should be understood to mean an angularly resolved scattering function, for example the BRDF scattering function known to a person skilled in the art, wherein BRDF stands for the English term "bidirectional reflective distribution function".

The scattering structure is part of the illumination system, i.e. not part of a reticle bearing the mask structures or the measurement structure. Furthermore, the scattering structure is arranged on the illumination side with respect to the mask plane, i.e. on that side of the mask plane from which the mask structures are irradiated by the exposure radiation during exposure operation. The measurement illumination beam path differs from the exposure illumination beam path in the illumination system. A rectilinear course of the measurement beam path between the measurement structure and the mask plane should be understood to mean that the direction of propagation of the measurement radiation guided by the measurement beam path runs rectilinearly between the measurement structure and the mask plane, i.e. does not experience any deflection. The feature according to which the measurement illumination beam path extends via the scattering structure should be understood to mean that the measurement illumination beam path either passes through the measurement structure or is reflected at the latter.

As a result of the measurement illumination beam path extending via a scattering structure, the pupil filling of the projection lens can be considerably improved. The scattering structure converts the illumination radiation incident on the measurement structure into diffuse radiation. This results in a significantly closer-meshed arrangement of the intersection points of the paths of the individual rays emanating from the measurement structure with the pupil plane, and in an improved illumination of the entire pupil including the marginal regions thereof.

The arrangement of the scattering structure on the illumination site enables the measurement structure to be used in reflection. In comparison with a use of the measurement structure in transmission, wherein said measurement structure is arranged e.g. on a thin membrane, the robustness of the measuring method thus increases since the measurement structure can now be arranged on a comparatively solid reticle. In the case of a possible arrangement of the measurement structure on a thin membrane, the irradiation with the illumination radiation can result in deformations of the membrane on account of thermal effects, whereby measurement errors can result or, as a countermeasure, it is necessary to reduce the intensity of the illumination radiation whilst accepting longer measurement times.

Arranging the scattering structure outside the exposure illumination beam path prevents exposure operation from being adversely affected by the scattering structure. The rectilinear course of the measurement illumination beam path between the scattering structure and the mask plane reduces the complexity of the measuring arrangement.

According to one embodiment of the projection exposure apparatus, the illumination system comprises a facet mirror comprising a plurality of mirror elements configured, during exposure operation, to radiate the illumination radiation onto the object field via various radiation channels forming the exposure illumination beam path, wherein at least one of the mirror elements is mounted adjustably between an exposure position, in which at least one part of the illumination radiation is directed onto the object field via one of the radiation channels by the adjustable mirror element, and a measurement position, in which a beam path of the illumination radiation that extends via the adjustable mirror element forms the measurement illumination beam path. In other words, the radiation channel assigned to the adjustably mounted mirror element in the measurement position is directed onto the scattering structure, from which the illumination radiation scattered at said scattering structure, in measurement operation of the projection exposure apparatus, impinges on the measurement structure.

The objects mentioned above are also achieved in accordance with a second aspect of the invention by a microlithographic projection exposure apparatus comprising a projection lens for imaging an object field arranged in a mask plane onto a substrate during exposure operation of the projection exposure apparatus, and an illumination system. The illumination system comprises a scattering structure and at least one facet mirror comprising a plurality of mirror elements. The mirror elements are configured, during exposure operation, to radiate illumination radiation into the object field via various radiation channels. At least one of the mirror elements is mounted adjustably between an exposure position and a measurement position. In the exposure position, at least one part of the illumination radiation is directed onto the object field over one of the radiation channels via an adjustable mirror element. In this case, the illumination radiation, from the adjustable mirror element, can be directed onto the object field directly or else pass via some other mirror beforehand. In the measurement position, a beam path of the illumination radiation that extends via the adjustable mirror element is directed onto the scattering structure, from which the illumination radiation scattered at said scattering structure, in measurement operation of the projection exposure apparatus, impinges on a measurement structure arranged in the mask plane.

In the exposure position of the adjustably mounted mirror element, the radiation channel assigned to the adjustably mounted mirror element, in a section that proceeds from the adjustably mounted mirror element, i.e. the section between the mirror element and the object field, is directed onto the object field directly. If the radiation channel only proceeds from the adjustably mounted mirror element, the radiation channel assigned to the adjustably mounted mirror element is directed onto the object field directly over the entire course of the radiation channel. That is to say that the radiation channel, on the path between the adjustably mounted mirror element and the object field, impinges on no further optical element, in particular on no beam deflecting optical element, such as a mirror, for instance. In particular, the at least one mirror element is mounted tiltably between the exposure position and the measurement position.

On account of the adjustably mounted mirror element of the facet mirror, it is possible, without reconstruction outlay, to switch from exposure operation to measurement operation, in which the beam path used here extends via the scattering structure. Thus, the incorporation of the scattering structure makes it possible to improve the accuracy of the measurement, without increasing the complexity of the measurement.

In one embodiment of the projection exposure apparatus in accordance with the first or the second inventive aspect, the scattering structure is a reflective structure. In other words, the scattering structure is embodied as a scattering mirror. In an embodiment for EUV microlithography, the scattering mirror can have a micro- or nanostructured substrate, on which a reflective EUV multilayer coating is applied. The micro- or nanostructuring of the substrate can be produced for example by sandblasting of the substrate.

In a further embodiment of the projection exposure apparatus in accordance with the first or the second inventive aspect, the scattering structure is arranged at a housing of at least one optical element of the illumination system or of at least one section of a beam path of the illumination radiation. The beam path of the illumination radiation should be understood to mean in particular the exposure illumination beam path mentioned above or in particular the beam path comprising the radiation channels. The beam path housed at least in sections can also be referred to as a "light pipe". A housing should be understood to mean a protective structure which at least partially surrounds the optical element and which serves to stem flows in the gas surrounding the optical element or the gas in the light pipe and thus to prevent striation. The gas mentioned may be residual gas remaining in a vacuum. The housing need not be completely closed, but rather may have openings for the exposure beam path and, if appropriate, the measurement beam path. In accordance with one embodiment variant, the scattering structure is arranged on an outer side of the housing.

In a further embodiment of the projection exposure apparatus in accordance with the first or the second inventive aspect, the illumination system is configured for operation in the EUV wavelength range, i.e. in the wavelength range of less than 100 nm, in particular a wavelength of approximately 13.5 nm or approximately 6.8 nm. The exposure radiation provided by the illumination system thus comprises EUV radiation.

In a further embodiment of the projection exposure apparatus in accordance with the first or the second inventive aspect, said projection exposure apparatus furthermore comprises a sensor module for measuring a wavefront aberration of the projection lens over a measurement beam path including the scattering structure. In accordance with one embodiment variant, the sensor module is arranged in, preferably integrated into, the region of the image plane of the projection lens, in particular at a substrate table of the projection exposure apparatus. In accordance with one embodiment variant, the sensor module comprises an analysis grating and a detector arranged below the analysis grating.

In accordance with a further embodiment of the projection exposure apparatus in accordance with the second inventive aspect, the facet mirror is arranged in a plane that is conjugate with respect to the mask plane, and the illumination system comprises a further facet mirror, which is arranged in a pupil plane, wherein the mirror elements of the facet mirror arranged in the plane that is conjugate with respect to the mask plane are configured, in exposure radiation operation, to irradiate the mirror elements of the further facet mirror. In the context of this application, the facet mirror arranged in the plane that is conjugate with respect to the mask plane is also referred to as a field facet mirror and the further facet mirror is also referred to as a pupil facet mirror.

In accordance with a further embodiment, in the exposure position, the at least one part of the illumination radiation is directed onto the object field by the adjustable mirror element via a first mirror element of the further facet mirror arranged in the pupil plane and, in the measurement position, the beam path directed onto the scattering structure extends via a further mirror element of the further facet mirror.

In accordance with a further embodiment, the further mirror element of the further facet mirror is mounted adjustably between an exposure position and a measurement position. In the exposure position, the illumination radiation coming from a further mirror element of the first facet mirror is directed onto the object field by the further mirror element, and in the measurement position, the illumination radiation coming from the first facet mirror is directed onto the scattering structure by the further mirror element.

In a further embodiment of the projection exposure apparatus in accordance with the second inventive aspect, the first-mentioned facet mirror is arranged in a pupil plane of the illumination system, and the illumination system comprises a further facet mirror. The further facet mirror is arranged in a plane that is conjugate with respect to the mask plane, and comprises mirror elements configured, in exposure radiation operation, to irradiate the mirror elements of the facet mirror arranged in the pupil plane. In this case, therefore, the field facet mirror is referred to as the further facet mirror. In this case, the mirror elements of the facet mirror arranged in the pupil are assigned respectively to one of the different radiation channels and, in the exposure position of the adjustably mounted mirror element of the pupil facet mirror, the assigned radiation channel is directed onto the object field directly by said mirror element. In accordance with one embodiment variant, in exposure operation each mirror element of the facet mirror arranged in the plane that is conjugate with respect to the mask plane is assigned respectively to exactly one facet mirror of the facet mirror arranged in the pupil plane for forming a respective radiation channel. In other words, the two facet mirrors have the same number of mirror elements and each mirror element of one facet mirror is assigned to exactly one mirror element of the other facet mirror, wherein no mirror element of one facet mirror is assigned to a plurality of mirror elements of the other facet mirror.

In one embodiment of the projection exposure apparatus in accordance with the second inventive aspect, the facet mirror comprises a controllable actuator for adjusting the adjustably mounted mirror element.

Furthermore, a method for measuring an imaging aberration at a microlithographic projection exposure apparatus is provided in accordance with the first aspect according to the invention. The projection exposure apparatus comprises a projection lens for imaging an object field arranged in a mask plane onto a substrate during exposure operation of the projection exposure apparatus, and an illumination system comprising an exposure illumination beam path for radiating illumination radiation onto the object field on the illumination side with respect to the mask plane. The method according to the invention comprises arranging a measurement structure in the mask plane, and irradiating the measurement structure with the illumination radiation along a measurement illumination beam path. The measurement illumination beam path extends via a scattering structure and runs rectilinearly between the scattering structure and the mask plane. The scattering structure is arranged on the illumination side with respect to the mask plane and outside the exposure illumination beam path.

Furthermore, a further method for measuring an imaging aberration at a microlithographic projection exposure apparatus is provided in accordance with the second aspect according to the invention. The projection exposure apparatus comprises a projection lens for imaging an object field arranged in a mask plane onto a substrate during exposure operation of the projection exposure apparatus, and an illumination system. The illumination system comprises a facet mirror comprising a plurality of separate mirror elements assigned respectively to a different radiation channel. The mirror elements are configured, during exposure operation, to radiate illumination radiation onto the object field via the various radiation channels. The method comprises arranging a measurement structure in the mask plane, and arranging at least one of the mirror elements in a measurement position, in which a beam path of the illumination radiation that extends via the mirror element arranged in the measurement position is directed onto a scattering structure. From the scattering structure, the illumination radiation scattered at said scattering structure impinges on the measurement structure.

The features indicated with regard to the above-specified embodiments, exemplary embodiments or embodiment variants, etc., of the projection exposure apparatus in accordance with the first or the second aspect according to the invention can correspondingly be applied to the measuring method according to the invention in accordance with the corresponding aspect according to the invention. These and other features of the embodiments according to the invention are explained in the description of the figures and in the claims. The individual features can be implemented, either separately or in combination, as embodiments of the invention. Furthermore, they can describe advantageous embodiments which are independently protectable and protection for which is claimed if appropriate only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings. In the figures.

DETAILED DESCRIPTION

In the exemplary embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the invention.

Figure 1:
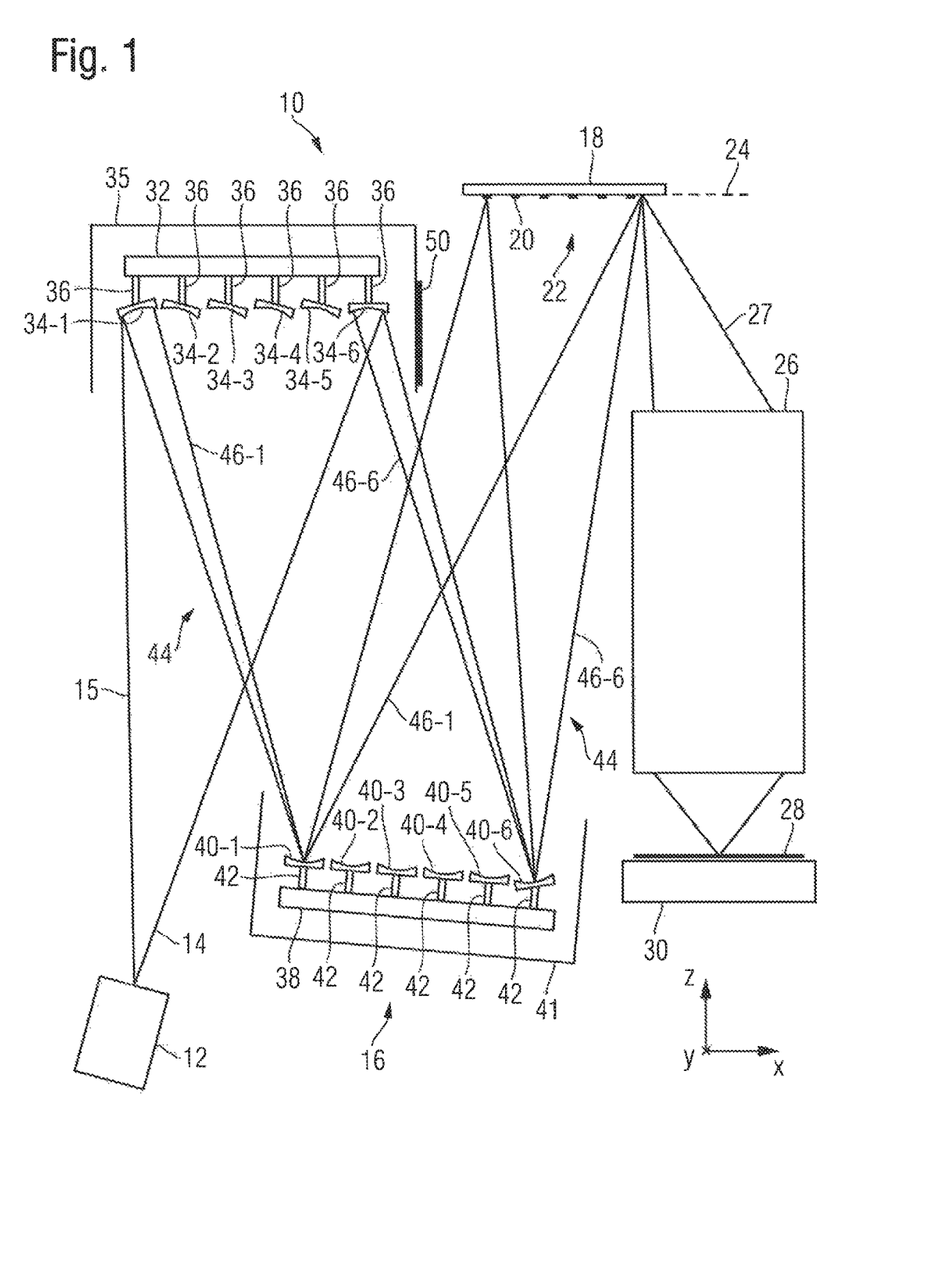
FIG. 1 shows a schematic illustration of a sectional view of a projection exposure apparatus in one embodiment according to the invention in exposure operation, wherein the projection exposure apparatus comprises an illumination system having a field facet mirror and a pupil facet mirror.

In order to facilitate the description, a Cartesian xyz-coordinate system is indicated in the drawing, from which system the respective positional relationship of the components illustrated in the figures is evident. In FIG. 1, the y-direction runs perpendicular and into the drawing plane, the x-direction toward the right, and the z-direction upwardly.

FIG. 1 shows, in a schematic view, a microlithographic projection exposure apparatus 10 for producing microstructured components, e.g. containing integrated circuits. The projection exposure apparatus 10 serves to transfer mask structures 20 arranged on an exposure reticle 18 to a photosensitive layer of a substrate 28. Generally so-called wafers composed of silicon or some other semiconductor material are used as the substrate 28.

The projection exposure apparatus 10 contains for this purpose a radiation source 12, an illumination system 16, a reticle stage (not illustrated in the drawing) for mounting and positioning the exposure reticle 18, a projection lens 26 in the form of an imaging optical system having a plurality of optical elements for imaging the mask structures 20 onto the substrate 28 in exposure operation of the projection exposure apparatus 10, and a substrate stage 30 for mounting and positioning the substrate 28.

In exposure operation, the illumination system 16 serves to radiate illumination radiation 14 with a suitable angular distribution onto an object field 22 of the exposure reticle 18 arranged in a mask plane 24. To that end, the illumination system 16 in the embodiment shown comprises two facet mirrors, namely a field facet mirror 32 arranged in a plane that is conjugate with respect to the mask plane 24, said plane also being referred to as the field plane, and a pupil facet mirror 38 arranged in a pupil plane of the illumination system 16.

The illumination radiation 14 is generated by a radiation source 12 and is radiated in the form of an incident wave 15 onto the field facet mirror 32. Depending on the design of the projection exposure apparatus 10, the wavelength of the illumination radiation 14 can be in the UV wavelength range, e.g. at 365 nm, 248 nm or 193 nm, or in the EUV wavelength range, i.e. in a wavelength range of less than 100 nm, in particular at a wavelength of approximately 13.5 or approximately 6.7 nm. In the case illustrated here, the illumination radiation 14 is EUV radiation; thus, all optical elements of the exposure beam path of the projection exposure apparatus 10 are embodied as mirrors.

Figure 3:
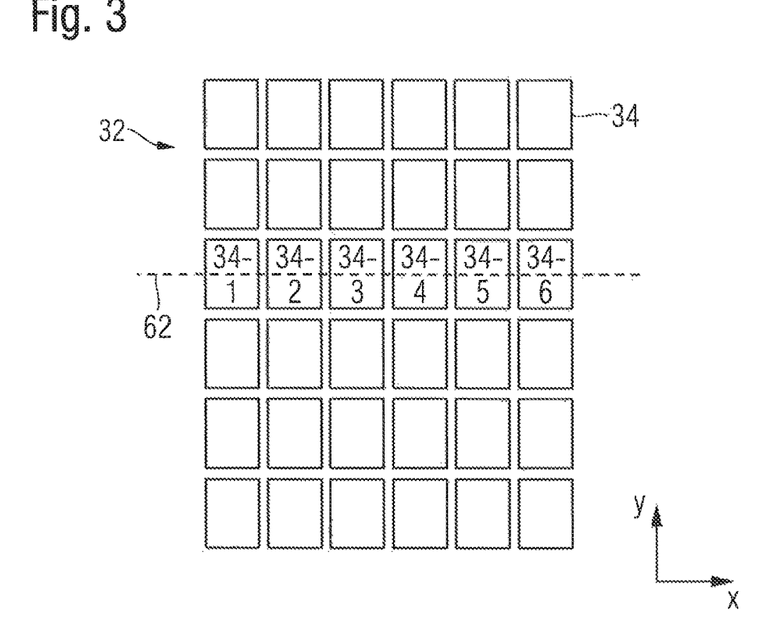
FIG. 3 shows a plan view of the field facet mirror in accordance with FIG. 1 and FIG. 2, respectively.

The field facet mirror 32 comprises a two-dimensional grid of mirror elements 34. FIG. 3 illustrates the field facet mirror 32 in a plan view with an exemplary embodiment of the grid comprising six times six mirror elements 34. In further embodiments, the field facet mirror 32 can comprise fewer or else more, in particular even hundreds of, mirror elements 32. The respective shape of the mirror elements 34 is adapted to the shape of the object field 22 in the mask plane 24 and is therefore rectangular in the embodiment illustrated. However, the shape of the mirror elements 34 may also have an arcuate or other shape. Here in the case of a projection exposure apparatus 10 embodied as a step and scan exposure apparatus, the object field 22 is understood to mean that area on the exposure reticle 18 which is illuminated by the scanner slot at a given point in time. The two-dimensional grid of the mirror elements 34 is orthogonal in the embodiment shown. FIG. 1 illustrates the field facet mirror 32 in sectional view along the sectional line 62 from FIG. 3. Six mirror elements 34-1 to 34-6 are arranged along said sectional line 62. Each of the mirror elements 34 of the field facet mirror 32 is mounted individually adjustably with a respective actuator 36. In particular, an individual tilting of the respective mirror element 34 about two mutually orthogonal tilt axes is possible. The actuators 36 are driven by a control device.

Figure 4:
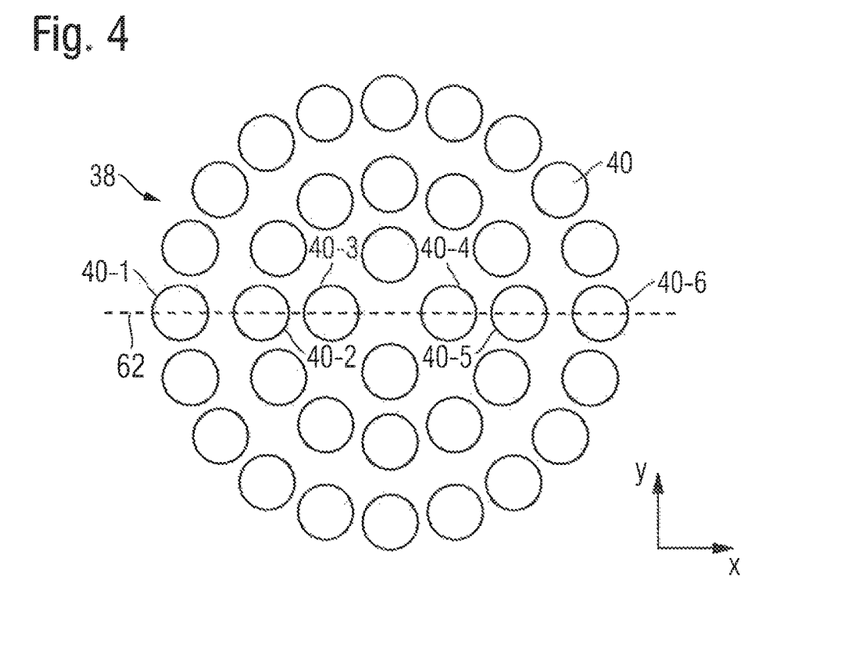
FIG. 4 shows a plan view of the pupil facet mirror in accordance with FIG. 1 and FIG. 2, respectively.

The pupil facet mirror 38 likewise comprises a two-dimensional arrangement of mirror elements 40. FIG. 4 illustrates the pupil facet mirror 32 in a plan view with an exemplary embodiment of an arrangement of thirty-six mirror elements 40. In further embodiments, the pupil facet mirror 38 may comprise fewer or else more, in particular even hundreds of, mirror elements 38. In the embodiment shown, the number of mirror elements 40 of the pupil facet mirror 38 corresponds to the number of mirror elements 36 of the field facet mirror 32. In other embodiments, the number of mirror elements 40 of the pupil facet mirror 38 may also be less than the number of mirror elements 36 of the field facet mirror 32, and vice versa. The mirror elements 40 are arranged along concentric circles in the embodiment shown. In this case, the shape of the mirror elements 40 in plan view is likewise circular, but a different shape, such as a rectangular shape, for instance, may also be used. Furthermore, the arrangement of the mirror elements may also be configured differently, e.g. in a hexagonally packed fashion.

FIG. 1 illustrates the pupil facet mirror 38 in a sectional view along the sectional line 62 from FIG. 4. Six mirror elements 40-1 to 40-6 are arranged along said sectional line 62. Each of the mirror elements 40 of the pupil facet mirror 38 in the embodiment shown is mounted individually adjustably by a respective actuator 42. In particular, an individual tilting of the respective mirror element 40 about two mutually orthogonal tilt axes is possible. The actuators 42 are driven via a control device. The construction of the facet mirrors 32 and 38 may be embodied in particular in accordance with one of the variants described in US 2011/0001947 A1. In other embodiments, the mirror elements 40 of the pupil facet mirror 39 may be arranged nonadjustably, i.e. without assigned actuators 42.

In the embodiment illustrated in the figures, each mirror element 34 of the field facet mirror 32 is assigned to exactly one mirror element 40 of the pupil facet mirror 38 for forming a respective radiation channel 46. In this regard, in the embodiment illustrated in FIG. 1, the mirror elements 34-1 and 40-1, 34-2 and 40-2, 34-3 and 40-3, 34-4 and 40-4, 34-5 and 40-5 and also 34-6 and 40-6 are respectively assigned to one another.

In the setting of the illumination system 16 as shown in FIG. 1, the exposure reticle 18 is illuminated with an annular angular distribution. To that end, the illumination radiation 14 is radiated onto the object field 22 only by the mirror elements 40 which are arranged along the outer ring in accordance with FIG. 4. In the sectional view in FIG. 1, therefore, only the mirror elements 40-1 and 40-6 of the pupil facet mirror 38 are active, that is to say that only these mirror elements are irradiated by the mirror elements 34-1 and 34-6 of the field facet mirror 32 that are respectively assigned to them in order to form the radiation channels 46-1 and 46-6 respectively illuminating the entire object field 22.

The mirror elements 34-2 to 34-5 of the field facet mirror 32 are tilted in each case in such a way that that radiation proportion of the incident wave 15 which impinges on them does not impinge on the pupil facet mirror 38. The radiation channels assigned to the mirror elements 34-2 and 40-2, 34-3 and 40-3, 34-4 and 40-4 and also 34-5 and 40-5 are thus not activated in the shown position of the illumination system 16. The radiation channels 46-1 and 46-6 which proceed from the mirror elements 34-1 and 34-6 and extend as far as the mask plane 20, together with those radiation channels which are assigned to the further mirror elements arranged along the outer ring in accordance with FIG. 4, form an exposure illumination beam path 44.

The facet mirrors 32 and 38 are each surrounded by a housing 35 and 41, respectively. Here the housings 35 and 41 may, as illustrated in FIG. 1, each be embodied separately or else configured in a continuous fashion. The housings 35 and 41 form a so-called "mini-environment" within the illumination system 16 for the respective section of the illumination beam path 44 in the region of the facet mirrors 32 and 38. In this case, the housings 35 and 41 may be configured as containers having openings for the emergence and entrance of the illumination radiation 15. The function of the housings 35 and 41 consists, inter alia, in stemming flows in the gas volume surrounding the facet mirrors 32 and 38 and, if appropriate, in the adjoining gas volume of the illumination beam path 44, and thus preventing striation in the gas volume. Furthermore, the housings may serve to prevent contamination of the mirror surfaces by particles. Such striation may result in disturbances in the illumination wave radiated onto the object field 22, and thus in losses of quality in the lithographic imaging. In the present case of an EUV projection exposure apparatus, in which the optical beam path runs in a vacuum, the gas volume should be understood to mean a residual gas remaining in said vacuum. The imaging of the mask structures 20 of the exposure reticle 18 is effected with an imaging beam path 27 passing through the projection lens 26.

Figure 2:
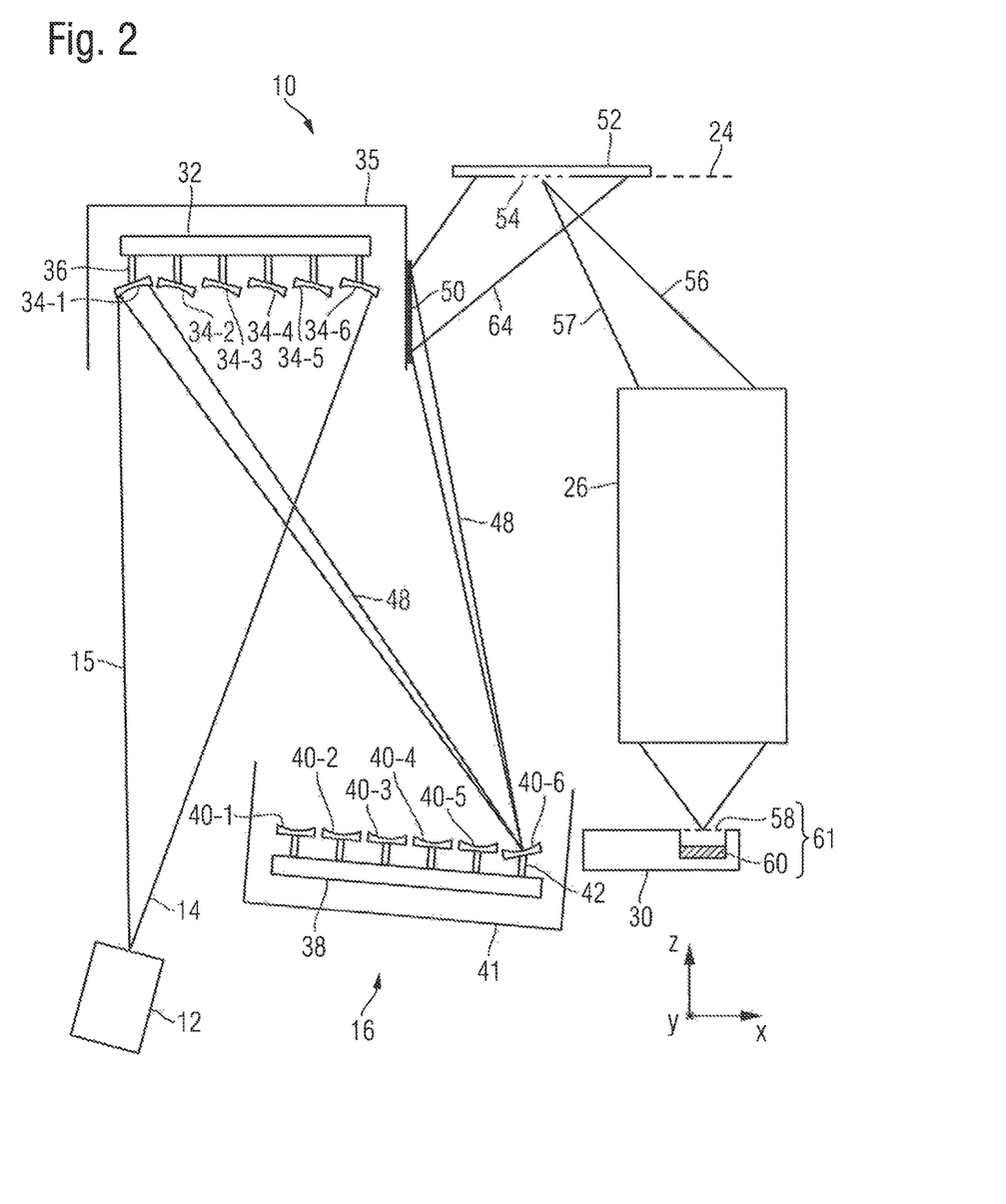
FIG. 2 shows a schematic illustration of a sectional view of the projection exposure apparatus in accordance with FIG. 1 in measurement operation.

For the highly accurate measurement of the wavefront aberrations of the projection lens 26, as illustrated in FIG. 2, a measurement reticle 52 having a measurement structure 54 is arranged in the mask plane 24, from which a measurement radiation 57 emanates and passes through the projection lens 26 in a measurement beam path 36. In this case, the measurement radiation 57 passes along different paths through the projection lens 26. By way of example, a method of shearing interferometry may be used here as a measuring method. In this case, a so-called coherence mask, which may be embodied e.g. as a diffraction grating having a size of approximately 100 μm×100 μm, serves as a measurement structure 54. Shearing interferometry is a phase shifting interferometry technique in which a phase shifting structure, such as, for example, a displaceable diffraction grating, referred to hereinafter as analysis grating 58, is arranged in the image plane. In the present embodiment, the analysis grating 58 is integrated into the substrate stage 30 of the projection exposure apparatus 10. A detector 60 having a detection area for spatially resolved intensity detection is arranged below the analysis grating 58. The analysis grating 58 and the detector 60 together form a sensor module 61 for measuring a wavefront aberration.

In the context of measurement operation for measuring an imaging aberration of the projection lens 26, as illustrated in FIG. 2, the analysis grating 58 is displaced in small steps transversely with respect to the optical axis of the projection lens 26. From the interference patterns or shearograms detected by the detector 60, it is possible to determine the spatial derivative of the wavefront in the direction of movement of the analysis grating 58 and therefrom the topography of the wavefront and finally a wavefront aberration of the projection lens 26.

For complete measurement of the projection lens 26 with high accuracy, it is important to illuminate the pupil of the projection lens 26 with the measurement radiation 57 as fully as possible, that is to say that the paths of the measurement beam path 56 which pass through the projection lens 26 are intended to be distributed as closely meshed as possible over the entire pupil of the projection lens 26. This is carried out by the measurement structure 54 being illuminated as diffusely as possible, that is to say that the measurement structure 54 is intended to be illuminated with radiation having a direction distribution that is as continuous and wide as possible. To that end, the illumination system 16 is configured to provide a measurement illumination beam path 48, which extends via a reflective scattering structure 50 in the form of a scattering mirror, said scattering structure being arranged on the illumination side with respect to the mask plane 24, i.e. below the mask plane 24 in accordance with FIG. 1. In this case, the reflective scattering structure can have a micro- or nanostructured substrate, on which a reflective EUV multilayer coating is applied. In this case, the scattering structure 50 is arranged at a near-mask location of the outer side of the housing 35 and thus outside the exposure illumination beam path 44 used in exposure operation. The scattering structure 50 should be understood to mean a structure which has a scattering effect on incident illumination radiation 15. The incident illumination radiation 15 is thus directed as diffuse radiation 64 onto the measurement structure 54 as a result of the reflective interaction with the scattering structure 50.

The measurement illumination beam path 48 running via the scattering structure 50 is generated by suitable driving of the actuators 36 of the field facet mirror 32 and, if appropriate, of the actuators 42 of the pupil facet mirror 38. In the embodiment illustrated in FIG. 2, all the mirror elements 34 of the field facet mirror 32 with the exception of the mirror element 34-1 arranged at the right-hand edge of the field facet mirror 32 are tilted away from the pupil facet mirror 38, such that the portions of the incident wave 15 that are reflected at said mirror elements 34 do not impinge on the pupil facet mirror 38. The mirror element 34-1 is tilted into a position in which that portion of the incident wave 15 which is incident on the mirror element 34-1 is directed onto the mirror element 40-6 arranged at the left-hand edge of the pupil facet mirror 38. That is to say that the mirror elements 34-1 and 40-6 which generate the mask illumination beam path 48 are arranged at opposite edge regions of their respective facet mirrors 32 and 38.

In the embodiment illustrated, the mirror element 40-6 of the pupil facet mirror 38 is tilted into a position in which the illumination radiation 14 reflected at it is directed onto the scattering structure 50. In other embodiments, the beam path geometry may be configured in such a way that the beam path 48 activated by the tilting of the mirror element 34-1 runs via the scattering structure 50 even without a tilting of the mirror element 40-6. In this case, as already indicated above, it is possible, if appropriate, to dispense with the actuators 42 of the pupil facet mirror 38. In accordance with further embodiments, it is also possible to set a plurality of pairs of mirror elements 34 of the field facet mirror 32 and mirror elements 40 of the pupil facet mirror 38 for forming the measurement illumination beam path 48. In other words, in this case, the scattering structure in accordance with these embodiments is irradiated by a plurality of mirror elements 40 of the pupil facet mirror 38.

The above description of exemplary embodiments is to be understood to be by way of example. The disclosure effected thereby firstly enables the person skilled in the art to understand the present invention and the advantages associated therewith, and secondly encompasses alterations and modifications of the described structures and methods that that would be evident in the understanding of the person skilled in the art following review of the present application. Therefore, all such alterations and modifications, insofar as they fall within the scope of the invention in accordance with the definition in the accompanying claims, and equivalents are intended to be covered by the protection of the claims.

LIST OF REFERENCE SIGNS

10 Projection exposure apparatus
12 Radiation source
14 Illumination radiation
15 Incident wave
16 Illumination system
18 Exposure reticle
20 Mask structures
22 Object field
24 Mask plane
26 Projection lens
27 Imaging beam path
28 Substrate
30 Substrate stage
32 Field facet mirror
34-1 to 34-6 Mirror elements of the field facet mirror
35 Housing
36 Actuator
38 Pupil facet mirror
40-1 to 40-6 Mirror elements of the pupil facet mirror
41 Housing
42 Actuator
44 Exposure illumination beam path
46-1 to 46-6 Radiation channels of the exposure illumination beam path
48 Measurement illumination beam path
50 Scattering structure
52 Measurement reticle
54 Measurement structure
56 Measurement beam path
57 Measurement radiation
58 Analysis grating
60 Detector
61 Sensor module
62 Sectional line
64 Diffuse radiation

What is claimed is:

1. Microlithographic projection exposure apparatus, comprising:
   a projection lens configured to image an object field arranged in a mask plane onto a substrate during exposure operation of the projection exposure apparatus, and
   an illumination system comprising:
      an exposure illumination beam path for radiating illumination radiation onto the object field on an illumination side with respect to the mask plane,
      a measurement illumination beam path for irradiating a measurement structure arranged in the mask plane with the illumination radiation, and
      a scattering structure arranged on the illumination side with respect to the mask plane and outside the exposure illumination beam path,
   wherein the measurement illumination beam path extends via the scattering structure and runs rectilinearly between the scattering structure and the mask plane.

2. Microlithographic projection exposure apparatus according to claim 1,
   wherein the illumination system further comprises a facet mirror comprising a plurality of mirror elements configured to radiate the illumination radiation, during the exposure operation, onto the object field via various radiation channels forming the exposure illumination beam path,
   wherein at least one of the mirror elements is mounted adjustably between
      an exposure position, in which at least one part of the illumination radiation is directed onto the object field over one of the radiation channels via the adjustable mirror elements, and
      a measurement position, in which a beam path of the illumination radiation that extends via the adjustable mirror element forms the measurement illumination beam path.

3. Microlithographic projection exposure apparatus, comprising:
   a projection lens configured to image an object field arranged in a mask plane onto a substrate during exposure operation of the projection exposure apparatus, and
   an illumination system comprising a scattering structure and at least one facet mirror comprising a plurality of mirror elements configured to radiate illumination radiation, during the exposure operation, onto the object field via various radiation channels,
   wherein at least one of the mirror elements is mounted adjustably between
      an exposure positon, in which at least one part of the illumination radiation is directed onto the object field over one of the radiation channels via the adjustable mirror element, and
      a measurement position, in which a beam path of the illumination radiation that extends via the adjustable mirror element is directed onto the scattering structure, and
   wherein the illumination radiation scattered at the scattering structure, in measurement operation of the projection exposure apparatus, is directed to impinge on a measurement structure arranged in the mask plane.

4. Microlithographic projection exposure apparatus according to claim 1,
   wherein the scattering structure is a reflective structure.

5. Microlithographic projection exposure apparatus according to claim 1,
wherein the scattering structure is arranged at a housing of at least one optical element of the illumination system or of at least one section of a beam path of the illumination radiation.

6. Microlithographic projection exposure apparatus according to claim 1,
wherein the illumination system is configured for operation in an extreme ultraviolet wavelength range.

7. Microlithographic projection exposure apparatus according to claim 1,
further comprising a sensor module configured to measure a wavefront aberration of the projection lens over a measurement beam path including the scattering structure.

8. Microlithographic projection exposure apparatus according to claim 2,
wherein the facet mirror is arranged in a plane that is conjugate with respect to the mask plane, and the illumination system comprises a further facet mirror which is arranged in a pupil plane, and
wherein the mirror elements of the facet mirror arranged in the plane that is conjugate with respect to the mask plane are configured to irradiate mirror elements of the further facet mirror in the exposure operation.

9. Microlithographic projection exposure apparatus according to claim 8,
wherein, in the exposure positon, the at least one part of the illumination radiation is directed onto the object field by the adjustable mirror element via a first mirror element of the further facet mirror arranged in the pupil plane and,
wherein, in the measurement positon, the beam path directed onto the scattering structure extends via a further mirror element of the further facet mirror.

10. Microlithographic projection exposure apparatus according to claim 9,
wherein the further mirror element of the further facet mirror is mounted adjustably between
the exposure position, in which the illumination radiation from a further mirror element of a first facet mirror is directed onto the object field by the further mirror element, and
the measurement positon, in which the illumination radiation from the first facet mirror is directed onto the scattering structure by the further mirror element.

11. Microlithographic projection exposure apparatus according to claim 2,
wherein the facet mirror is arranged in a pupil plane of the illumination system, and the illumination system comprises a further facet mirror, which is arranged in a plane that is conjugate with respect to the mask plane, and comprises mirror elements configured to irradiate the mirror elements of the facet mirror arranged in the pupil plane in the exposure operation.

12. Microlithographic projection exposure apparatus according to claim 2,
wherein the facet mirror comprises a controllable actuator configured to adjust the adjustably mounted mirror element.

13. Method for measuring an imaging aberration at a microlithographic projection exposure apparatus comprising a projection lens configured to image an object field arranged in a mask plane onto a substrate during exposure operation of the projection exposure apparatus, and an illumination system comprising an exposure illumination beam path for radiating illumination radiation onto the object field on an illumination side with respect to the mask plane, wherein the method comprises:
arranging a measurement structure in the mask plane, and
irradiating the measurement structure with the illumination radiation along a measurement illumination beam path, which extends via a scattering structure and runs rectilinearly between the scattering structure and the mask plane, wherein the scattering structure is arranged on the illumination side with respect to the mask plane and outside the exposure illumination beam path.

14. Method for measuring an imaging aberration at a microlithographic projection exposure apparatus comprising a projection lens configured to image an object field arranged in a mask plane onto a substrate during exposure operation of the projection exposure apparatus, and an illumination system comprising a scattering structure and at least one facet mirror comprising a plurality of mirror elements configured to radiate illumination radiation, during the exposure operation, onto the object field via various radiation channels, wherein the method comprises:
arranging a measurement structure in the mask plane, and
mounting at least one of the mirror elements adjustably between
an exposure position, in which at least one part of the illumination radiation is directed onto the object field over one of the radiation channels via the adjustable mirror element and
a measurement position, in which a beam path of the illumination radiation that extends via the adjustable mirror element is directed onto the scattering structure, and
wherein the illumination radiation scattered at the scattering structure in measurement operation of the projection exposure apparatus is directed to impinge on the measurement structure arranged in the mask plane.

15. Microlithographic projection exposure apparatus according to claim 3,
wherein the scattering structure is a reflective structure.

16. Microlithographic projection exposure apparatus according to claim 3,
wherein the scattering structure is arranged at a housing of at least one optical element of the illumination system or of at least one section of a beam path of the illumination radiation.

17. Microlithographic projection exposure apparatus according to claim 3,
wherein the illumination system is configured for operation in an extreme ultraviolet wavelength range.

18. Microlithographic projection exposure apparatus according to claim 3,
wherein the facet mirror is arranged in a plane that is conjugate with respect to the mask plane, and the illumination system comprises a further facet mirror which is arranged in a pupil plane, and
wherein the mirror elements of the facet mirror arranged in the plane that is conjugate with respect to the mask plane are configured to irradiate mirror elements of the further facet mirror in the exposure operation.

19. Microlithographic projection exposure apparatus according to claim 18,
wherein, in the exposure positon, the at least one part of the illumination radiation is directed onto the object field by the adjustable mirror element via a first mirror element of the further facet mirror arranged in the pupil plane and, wherein, in the measurement positon, the beam path directed onto the scattering structure extends via a further mirror element of the further facet mirror.

20. Microlithographic projection exposure apparatus according to claim 19,
wherein the further mirror element of the further facet mirror is mounted adjustably between
the exposure position, in which the illumination radiation from a further mirror element of a first facet mirror is directed onto the object field by the further mirror element, and
the measurement positon, in which the illumination radiation from the first facet mirror is directed onto the scattering structure by the further mirror element.

21. Microlithographic projection exposure apparatus according to claim 3,
wherein the facet mirror is arranged in a pupil plane of the illumination system, and the illumination system comprises a further facet mirror, which is arranged in a plane that is conjugate with respect to the mask plane, and comprises mirror elements configured to irradiate the mirror elements of the facet mirror arranged in the pupil plane in the exposure operation.

22. Microlithographic projection exposure apparatus according to claim 3,
wherein the facet mirror comprises a controllable actuator configured to adjust the adjustably mounted mirror element.

* * * * *